(12) United States Patent
Okachi

(10) Patent No.: US 11,493,013 B2
(45) Date of Patent: Nov. 8, 2022

(54) CURRENT DETECTOR, MANAGEMENT DEVICE, BATTERY FOR STARTING ENGINE

(71) Applicants: GS Yuasa International Ltd., Kyoto (JP); IRISO ELECTRONICS CO., LTD., Yokohama (JP)

(72) Inventor: Tomohiro Okachi, Kyoto (JP)

(73) Assignees: GS YUASA INTERNATIONAL LTD., Kyoto (JP); IRISO ELECTRONICS CO., LTD., Kanagawa (JP)

( * ) Notice: Subject to any disclaimer, the term of this patent is extended or adjusted under 35 U.S.C. 154(b) by 526 days.

(21) Appl. No.: 16/608,464

(22) PCT Filed: Apr. 26, 2018

(86) PCT No.: PCT/JP2018/016961
§ 371 (c)(1),
(2) Date: Oct. 25, 2019

(87) PCT Pub. No.: WO2018/199222
PCT Pub. Date: Nov. 1, 2018

(65) Prior Publication Data
US 2020/0088149 A1     Mar. 19, 2020

(30) Foreign Application Priority Data

Apr. 28, 2017  (JP) .............................. JP2017-089372

(51) Int. Cl.
*F02N 11/08*     (2006.01)
*G01R 31/3828*   (2019.01)
(Continued)

(52) U.S. Cl.
CPC ........ *F02N 11/0862* (2013.01); *B60R 16/033* (2013.01); *G01R 31/3828* (2019.01);
(Continued)

(58) Field of Classification Search
CPC . F02N 11/0862; H01M 10/48; H01M 10/425; H01R 12/716; H01R 13/502; H01R 13/631
See application file for complete search history.

(56) References Cited

U.S. PATENT DOCUMENTS 5,820,423 A     10/1998   Hsu
11,189,891 B2 *  11/2021   Fukushima ......... H02J 7/00304
(Continued)

FOREIGN PATENT DOCUMENTS

DE          2939594 A1     4/1981
DE    10-2006-019895 A1    11/2007
(Continued)

OTHER PUBLICATIONS

Extended European Search Report for European Patent Application No. 18792154.9, dated Apr. 9, 2020, (8 pages), Munich, Germany.
(Continued)

*Primary Examiner* — Abdullah A Riyami
*Assistant Examiner* — Nader J Alhawamdeh
(74) *Attorney, Agent, or Firm* — Alston & Bird LLP

(57) ABSTRACT

A current detector includes: a printed circuit board; and a resistor for detecting an electric current of the electrochemical device, wherein a connector having a first terminal is mounted on the printed circuit board, and the resistor has a second terminal which is brought into contact with the first terminal.

9 Claims, 13 Drawing Sheets

(51) Int. Cl.
*B60R 16/033* (2006.01)
*H01M 10/42* (2006.01)
*H01M 10/48* (2006.01)
*H01R 12/71* (2011.01)
*H01R 13/502* (2006.01)
*H01R 13/631* (2006.01)
*H01R 31/08* (2006.01)

(52) U.S. Cl.
CPC ......... H01M 10/425 (2013.01); H01M 10/48 (2013.01); H01R 12/716 (2013.01); H01R 13/502 (2013.01); H01R 13/631 (2013.01); H01R 31/08 (2013.01); *F02N 2200/062* (2013.01); *H01M 2010/4271* (2013.01); *H01M 2220/20* (2013.01); *H01R 2201/20* (2013.01)

(56) References Cited

U.S. PATENT DOCUMENTS

| | | | |
|---|---|---|---|
| 2002/0180405 A1 | 12/2002 | Batson | |
| 2013/0187575 A1 | 7/2013 | Yugou et al. | |
| 2014/0125429 A1 | 5/2014 | Yoshioka et al. | |
| 2014/0177145 A1* | 6/2014 | Kawahara | G01R 31/367 |
| | | | 361/679.01 |
| 2015/0226768 A1 | 8/2015 | Nakamura et al. | |
| 2016/0079633 A1* | 3/2016 | Wahlstrom | H01M 10/625 |
| | | | 429/82 |
| 2016/0093927 A1* | 3/2016 | Marcicki | H01M 10/4257 |
| | | | 429/50 |
| 2016/0139211 A1 | 5/2016 | Yoshioka et al. | |
| 2016/0146900 A1* | 5/2016 | Yu | G01R 31/364 |
| | | | 324/437 |
| 2016/0231359 A1 | 8/2016 | Nakamura et al. | |
| 2018/0156847 A1 | 6/2018 | Nakamura et al. | |
| 2018/0172735 A1 | 6/2018 | Arai et al. | |

FOREIGN PATENT DOCUMENTS

| | | |
|---|---|---|
| DE | 102012211701 A1 | 3/2013 |
| DE | 10-2013-200580 A1 | 7/2014 |
| EP | 0144128 A2 | 6/1985 |
| JP | S60-117574 A | 6/1985 |
| JP | H04-083175 A | 3/1992 |
| JP | 2004/117045 A | 4/2004 |
| JP | 2009-093896 A | 4/2009 |
| JP | 2011-047721 A | 3/2011 |
| JP | 2013/096881 A | 5/2013 |
| JP | 2014/059269 A | 4/2014 |
| JP | 2015-083944 A | 4/2015 |
| JP | 2016/095174 A | 5/2016 |
| JP | 2017/015588 A | 1/2017 |
| KR | 10-1448936 B1 | 10/2014 |
| KR | 101448936 B1 * | 10/2014 |
| WO | WO-2011/093105 A1 | 8/2011 |
| WO | WO-2012/043591 A1 | 4/2012 |
| WO | WO-2013/015219 A1 | 1/2013 |
| WO | WO-2014/203492 A1 | 12/2014 |
| WO | WO-2015/118364 A1 | 8/2015 |
| WO | WO-2016/208454 A1 | 12/2016 |

OTHER PUBLICATIONS

International Searching Authority, International Search Report and Written Opinion for International Application No. PCT/JP2018/016961, dated Jun. 26, 2018, (9 pages), Japanese Patent Office, Tokyo, Japan.

* cited by examiner

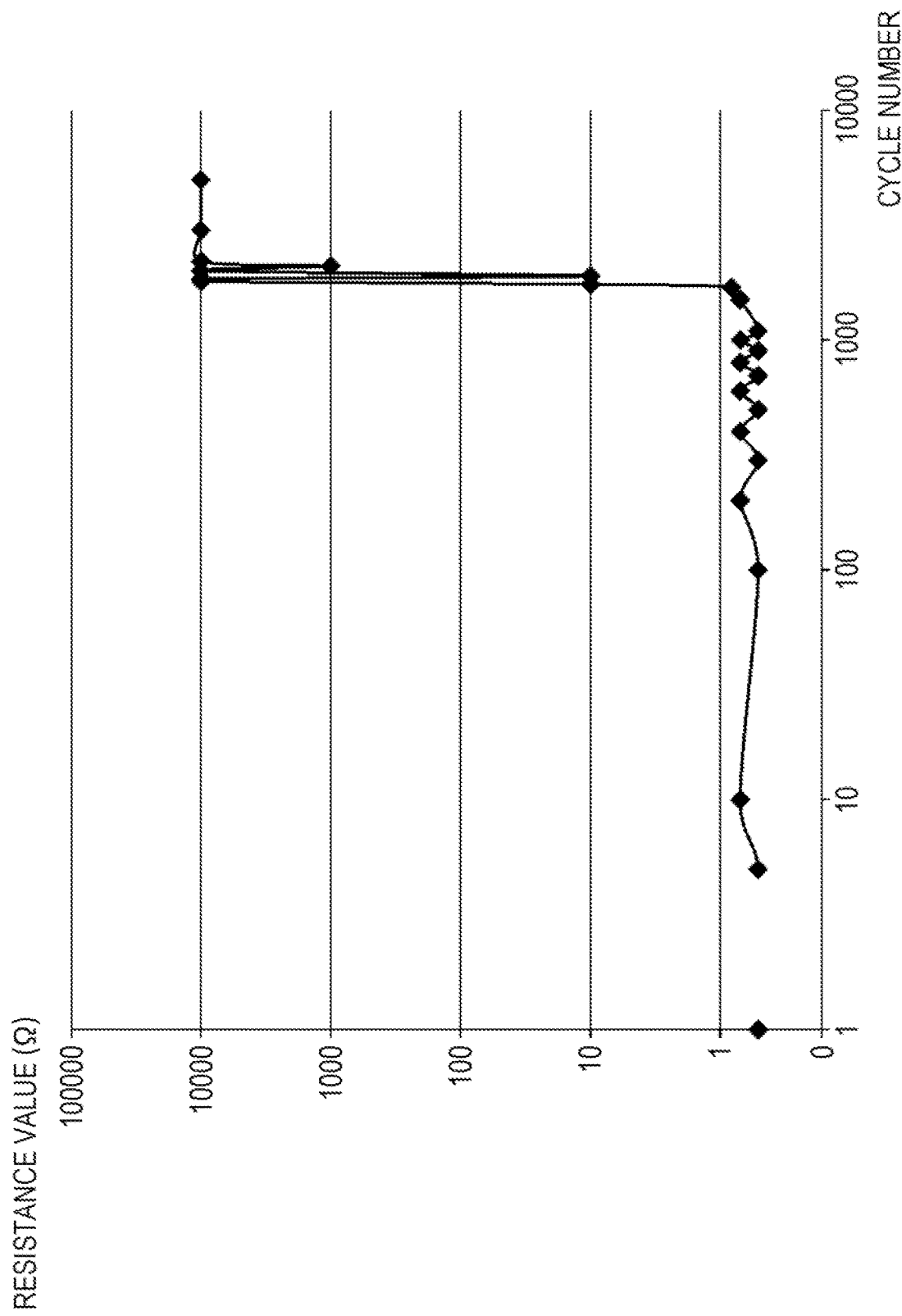

CURRENT DETECTOR, MANAGEMENT DEVICE, BATTERY FOR STARTING ENGINE

CROSS REFERENCE TO RELATED APPLICATIONS

This application is a national stage application, filed under 35 U.S.C. § 371, of International Application No. PCT/JP2018/016961, filed Apr. 26, 2018, which claims priority to Japanese Application No. 2017-089372, filed Apr. 28, 2017, the contents of all of which as are hereby incorporated by reference in their entirety.

BACKGROUND

Technical Field

The present invention relates to a technique for suppressing the increase of a resistance value caused by a temperature cycle of a resistor.

Description of Related Art

As a method of measuring an electric current of an electrochemical device such as a primary battery or a secondary battery, there has been known a method which detects voltages at both ends of a resistor by a data processing part disposed in a printed circuit board. Conventionally, the resistor is connected to the printed circuit board by fixing signal lines pulled out from the printed circuit board to both ends of the resistor using screws. Such a method requires a screw fixing operation for fixing the signal lines which results in poor mounting operability and the increase of the number of parts.

Besides the above-mentioned method, there has been also known a method where terminals of a resistor are made to pass through through holes formed in a printed circuit board and are directly fixed to the printed circuit board by soldering. As a literature which discloses such a method, for example, reference is made to JP-A-2004-117045.

BRIEF SUMMARY

The method where the terminals of the resistor are made to pass through the through holes and are bonded to the printed circuit board by soldering has the following advantages. A screw fixing operation becomes unnecessary, and the number of parts can be decreased. However, due to the repetition of a temperature cycle caused by generation of heat in the resistor due to supply of electricity, there is a possibility that a solder crack occurs in a bonding portion between the printed circuit board and the resistor so that a resistance value is increased.

Recently, there has been a demand for the increase of a state of charge (SOC) estimation accuracy of batteries from a market and hence, there has been a demand for suppression of the increase of a resistance value caused by the repetition of a temperature cycle.

The present invention has been made based on the above-mentioned circumstances, and an object of the present invention is to suppress the increase of a resistance value caused by a temperature cycle of a resistor.

A current detector of an electrochemical device includes: a printed circuit board; and a resistor for detecting an electric current of the electrochemical device, wherein a connector having a first terminal is mounted on the printed circuit board, and the resistor has a second terminal which is brought into contact with the first terminal.

With such a configuration, the second terminal of the resistor is brought into contact with the first terminal of the connector so that the resistor, which is a heat generating body, is electrically connected to the printed circuit board. That is, the resistor is electrically connected to the printed circuit board without using solder bonding via the through hole and hence, it is possible to suppress the increase of a resistance value caused by a temperature cycle. Further, the connector is mounted on the printed circuit board and hence, an electric wire for connecting the connector and the printed circuit board to each other becomes unnecessary whereby the number of parts can be decreased.

BRIEF DESCRIPTION OF THE FIGURES

FIG. 12 is a graph showing a relationship between a temperature cycle and a resistance value.

DETAILED DESCRIPTION OF VARIOUS EMBODIMENTS

Figure 1:
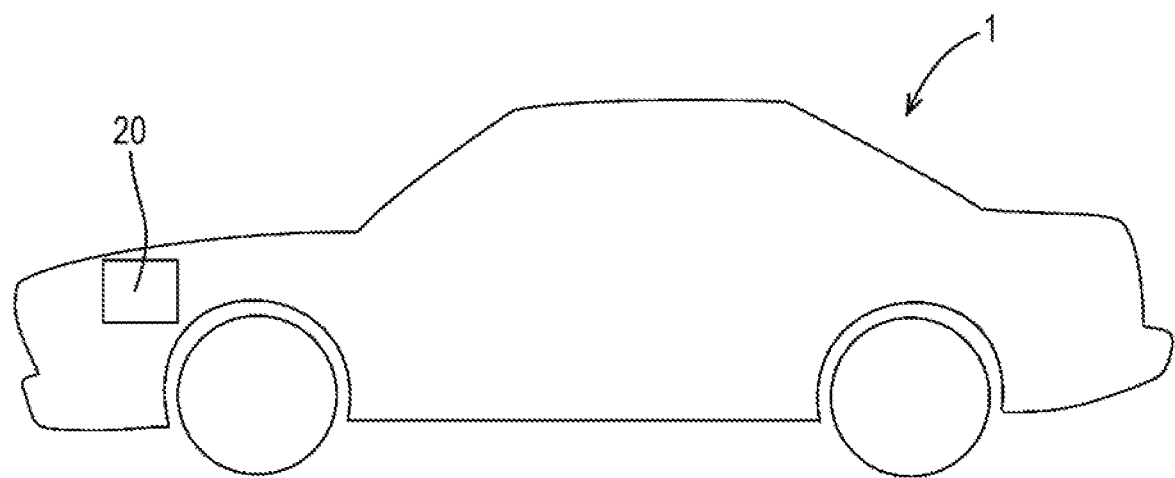
FIG. 1 is a side view of an automobile used in an embodiment 1.

A current detector of an electrochemical device includes: a printed circuit board; and a resistor for detecting an electric current of the electrochemical device, wherein a connector having a first terminal is mounted on the printed circuit board, and the resistor has a second terminal which is brought into contact with the first terminal. With such a configuration, the second terminal of the resistor is brought into contact with the first terminal of the connector so that the resistor, which is a heat generating body, is electrically connected to the printed circuit board. That is, the resistor is electrically connected to the printed circuit board without using solder bonding via the through hole and hence, it is possible to suppress the increase of a resistance value caused by a temperature cycle. Further, the connector is mounted on the printed circuit board and hence, an electric wire for connecting the connector and the printed circuit board to each other becomes unnecessary whereby the number of parts can be decreased.

In the above-mentioned configuration, the resistor may include: a resistance body; and plate portions positioned on both sides of the resistance body and disposed substantially parallel to the printed circuit board, the second terminal may be disposed substantially parallel to the plate portion and in a projecting manner from the plate portion, and the second terminal may be fitted in the inside of the first terminal of the connector. With such a configuration, the second terminal is disposed substantially parallel to the plate portion and in a projecting manner from the plate portion and hence, the second terminal can be easily fitted into the first terminal of the connector. Accordingly, assembling property of the resistor can be enhanced.

In the above-mentioned configuration, the second terminal may form a part of the same member as the plate portion. By forming the second terminal as the portion of the same member as the plate portion, compared to the case where the second terminal and the plate portion are made of different members (different kinds of metals), a connection resistance between the plate portion and the second terminal is small and hence, measurement accuracy of an electric current by the resistor can be enhanced.

In the above-mentioned configuration, the connector may include: an outer housing fixed to the printed circuit board; and an inner housing disposed movable in the inside of the outer housing, and the first terminal may be held in the inner housing. With such a configuration, when the resistor is positionally displaced with respect to the printed circuit board, because the inner housing is movable in the inside of the outer housing, the positional displacement of the resistor can be absorbed. Accordingly, a contact state between the first terminal of the connector and the second terminal of the resistor can be maintained and hence, the increase of a resistance value can be suppressed. Further, it is possible to provide the current detector having the configuration which strongly resists against vibration after being assembled.

A management device of an energy storage device includes: the current detector; and a data processing part mounted on the printed circuit board, wherein the data processing part is configured to estimate a charge state of the energy storage device based on an integrated value of an electric current detected by the resistor. The current integration method cumulates current measurement errors and hence, when the measurement is performed for a long period, there arises a drawback that estimation accuracy of a charge state is lowered. According to the management device of an energy storage device having the above-mentioned configuration, an electric current can be measured with high accuracy and hence, accumulation of errors can be decreased whereby estimation accuracy of a charge state can be enhanced.

A battery for starting an engine, which is mounted on a vehicle, includes: an energy storage device; and either one of the current detector or the management device. A large electric current flows in the battery for starting an engine within a short time at the time of cranking. Accordingly, a thermal shock is large and hence, a temperature of the resistor is easily increased. When solder bonding using a through hole is adopted, provability of the occurrence of a solder crack is high and hence, there is a particularly high possibility that a resistance value is increased. According to the battery for starting an engine having the above-mentioned configuration, solder bonding using a through hole is not adopted in the electrical connection between the resistor and the printed circuit board and hence, solder crack does not occur whereby the increase of a resistance value can be effectively suppressed.

Embodiment 1

1. Description of Battery

Figure 2:
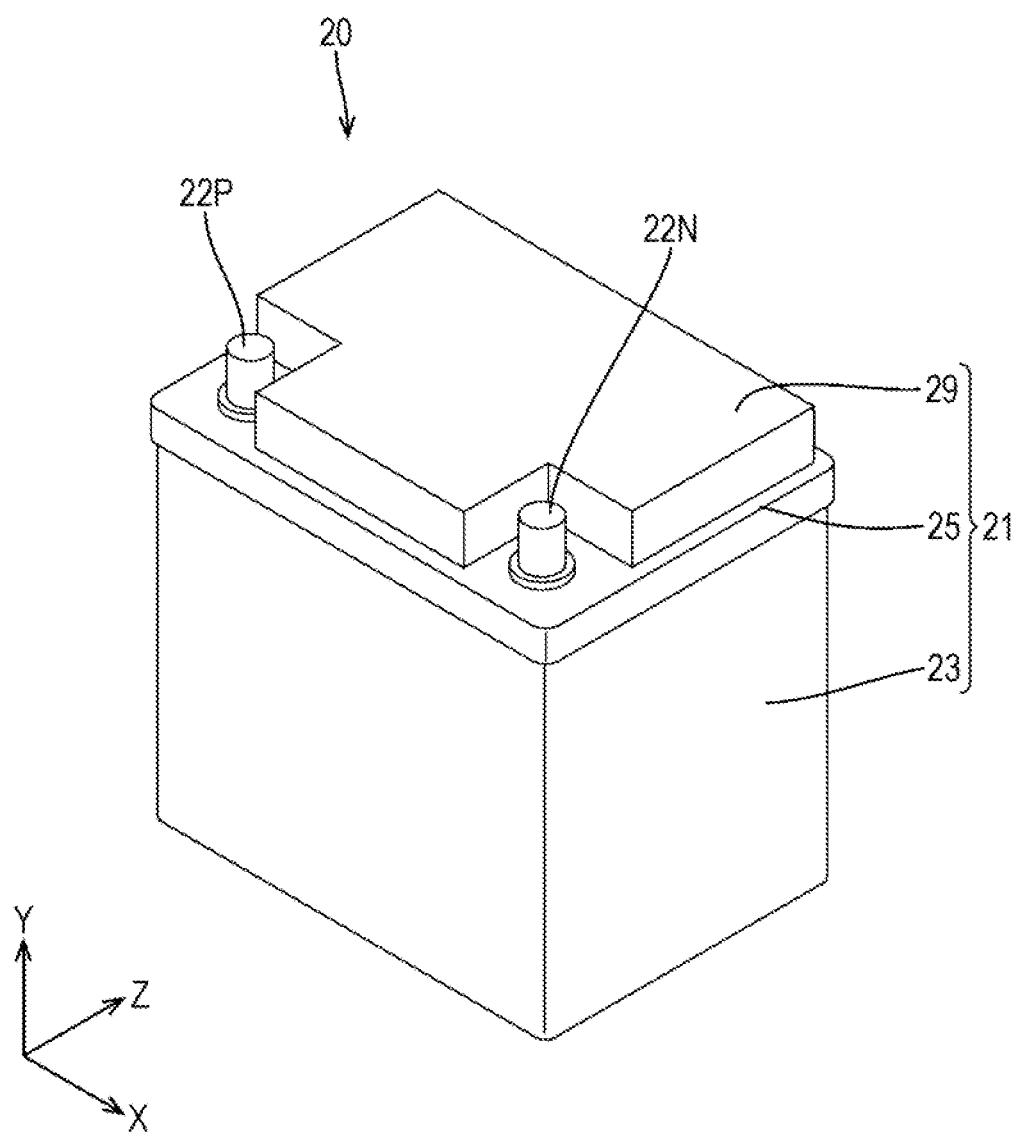
FIG. 2 is a perspective view of a battery.
Figure 3:
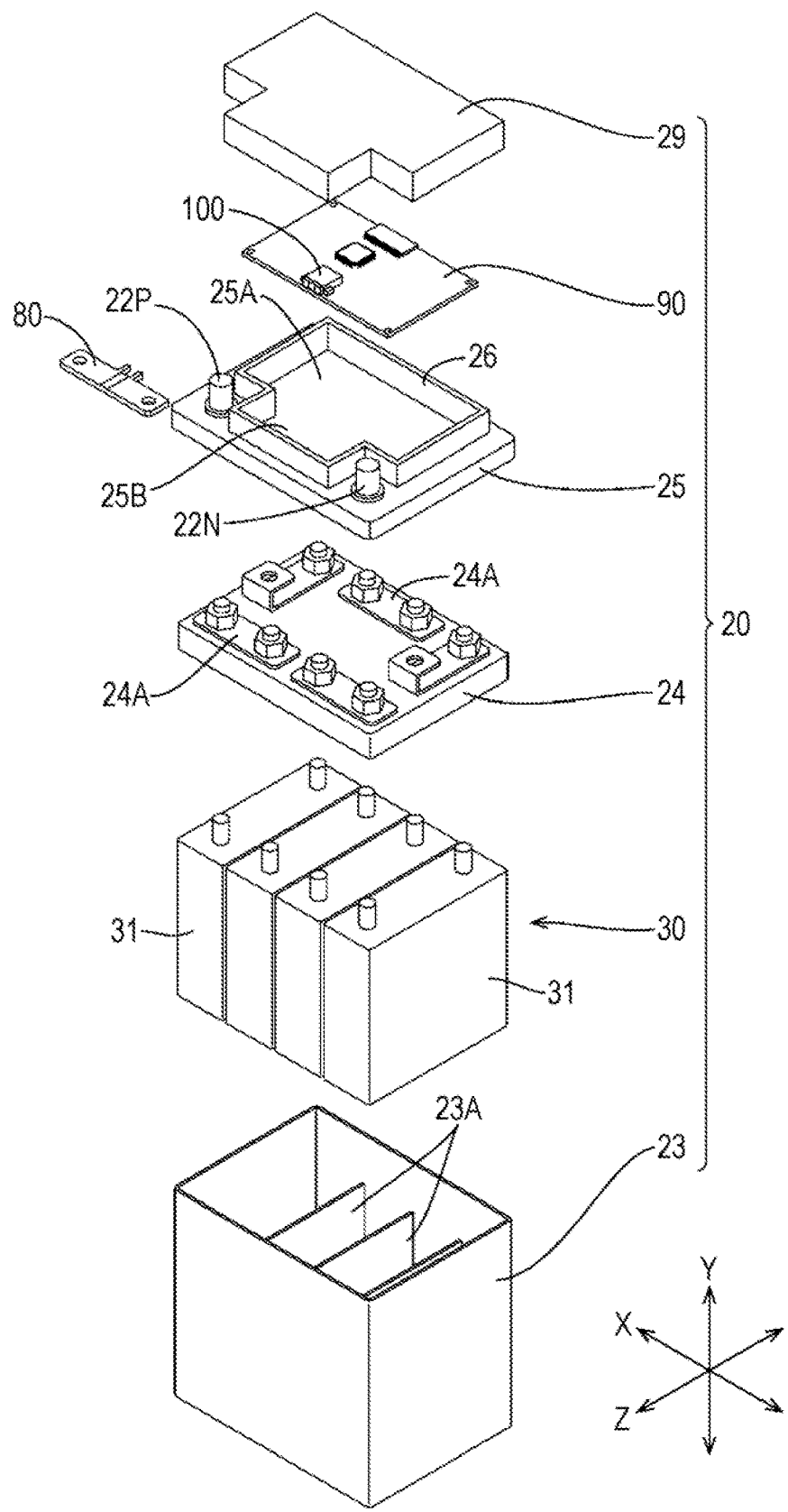
FIG. 3 is an exploded perspective view of the battery.
Figure 4:
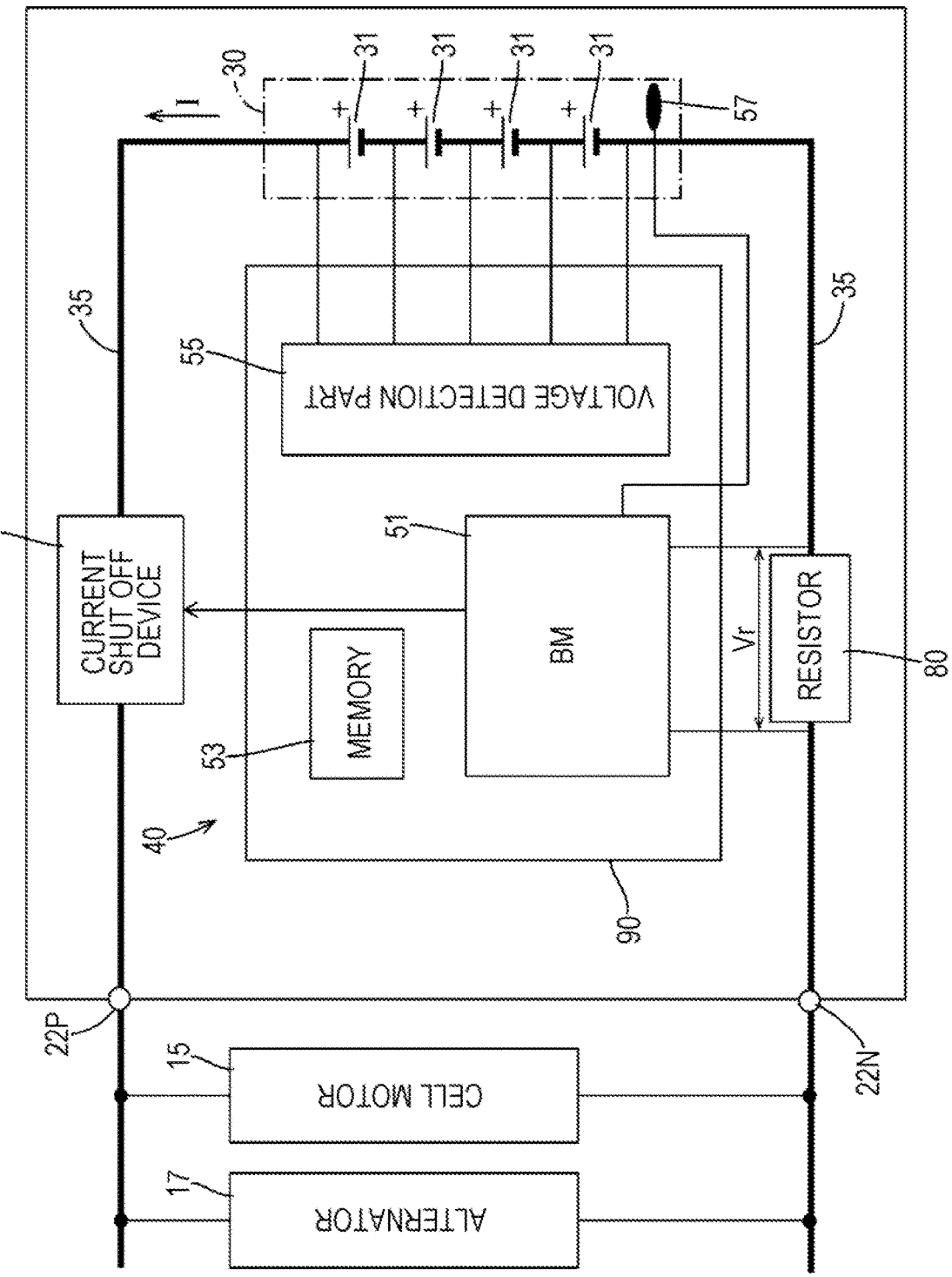
FIG. 4 is a block diagram showing the electrical configuration of the battery.

FIG. 1 is a side view of an automobile, FIG. 2 is a perspective view of a battery, FIG. 3 is an exploded perspective view of the battery, and FIG. 4 is a block diagram showing the electrical configuration of the battery. In FIG. 1, only the automobile 1 and the battery 20 are illustrated, and the illustration of other parts which form the automobile is omitted.

As shown in FIG. 1, the automobile (one example of a vehicle) 1 includes the battery 20. As shown in FIG. 2, the battery 20 includes a battery case 21 having a block shape. In the inside of the battery case 21, an assembled battery 30 formed of a plurality of secondary batteries 31, a resistor 80, and a printed circuit board 90 are accommodated. In the description made hereinafter, in the case where FIG. 2 and FIG. 3 are referenced, the description is made by assuming a vertical direction of the battery case 21 when the battery case 21 is placed horizontally without inclination with respect to a mounting surface as a Y direction, a direction along a long-side direction of the battery case 21 as an X direction, and a depth direction of the battery case 21 as a Z direction.

As shown in FIG. 3, the battery case 21 is formed of: a box-shaped case body 23 which opens upward; a positioning member 24 for positioning the plurality of secondary batteries 31; a middle lid 25 mounted on an upper portion of the case body 23; and an upper lid 29 mounted on an upper portion of the middle lid 25. A plurality of cell chambers 23A in each of which each secondary battery 31 is individually accommodated are disposed in the inside of the case body 23 in an arranged manner in an X direction.

As shown in FIG. 3, the positioning member 24 is configured such that a plurality of bus bars 24A are disposed on an upper surface of the positioning member 24. By disposing the positioning member 24 on upper portions of the plurality of secondary batteries 31 disposed in the inside of the case body 23, the plurality of secondary batteries 31 are positioned and, at the same time, the plurality of secondary batteries 31 are connected to each other by the plurality of bus bars 24A in series.

As shown in FIG. 3, the middle lid 25 has an approximately rectangular shape as viewed in a plan view, and a pair of terminal portions 22P, 22N to which harness terminals not shown in the drawing are connected is mounted on both end portions of the middle lid 25 in the X direction. The pair of terminal portions 22P, 22N is made of metal such as a lead alloy, for example. 22P indicates the positive electrode terminal portion, and 22N indicates the negative electrode terminal portion.

As shown in FIG. 3, the resistor 80 and the printed circuit board 90 are disposed on an upper surface of the middle lid 25, and an upper side of the middle lid 25 is closed by the upper lid 29.

The electrical configuration of the battery 20 is described with reference to FIG. 4. The battery 20 includes the assembled battery 30, the resistor 80, a current shut off device 45, a battery control part (hereinafter, referred to as BM) 51, a voltage detection part 55, a memory 53, and a temperature sensor 57 for detecting a temperature of the secondary batteries 31. The BM 51, the voltage detection part 55 and the memory 53 are mounted on the printed circuit board 90. The BM 51 is one example of "data processing part" of the present invention.

The assembled battery 30 is formed of the plurality of secondary batteries 31 connected in series. The assembled battery 30, the resistor 80, and the current shut off device 45 are connected in series via an electricity supply path 35. The resistor 80 is disposed on a negative electrode side, and the current shut off device 45 is disposed on a positive electrode side. The resistor 80 is connected to the negative electrode terminal portion 22N, and the current shut off device 45 is connected to the positive electrode terminal portion 22P.

The battery 20 is provided for starting an engine. As shown in FIG. 4, a cell motor 15 for starting the engine mounted on the automobile 1 is connected to the battery 20, and the cell motor 15 is driven by receiving the supply of electricity from the battery 20. Vehicle loads such as electrical components (not shown in the drawing) and an alternator 17 are connected to the battery 20 besides the cell motor 15. When an electricity generation amount of the alternator 17 is larger than power consumption of the vehicle loads, the battery 20 is charged by the alternator. When the power generation amount of the alternator is smaller than the power consumption of the vehicle loads, the battery 20 discharges electricity for compensating the shortage.

The current shut off device 45 is a relay or a semiconductor switch such as a field effect transistor (FET), and is disposed on the printed circuit board 90. The current shut off device 45 is disposed on the electricity supply path 35 of the assembled battery 30, and opens or closes the electricity supply path 35 of the secondary batteries 31.

The voltage detection part 55 is disposed on the printed circuit board 90. The voltage detection part 55 detects voltages of the respective secondary batteries 31 and a total voltage of the assembled battery 30.

The BM 51 is disposed on the printed circuit board 90. The BM 51 monitors voltages of the respective secondary batteries 31 and a total voltage of the assembled battery 30 based on an output of the voltage detection part 55. The BM 51 also detects an electric current I of the secondary batteries 31 based on a both end voltage Vr of the resistor 80 thus monitoring the electric current I.

When abnormality occurs in a voltage, an electric current or a temperature of the secondary battery 31, the BM 51 sends a command to the current shut off device 45 so that the current shut off device 45 shuts off an electric current whereby the battery 20 is protected.

The BM 51 estimates a state of charge (SOC) of the battery 20 based on an integrated value of an electric current I obtained based on a both end voltage Vr of the resistor 80 for a time as expressed by a following formula (2). With respect to a symbol of an electric current, "+" is given to the electric current at the time of charging and "−" is given to the electric current at the time of discharging.

$$SOC = Cr/Co \times 100 \quad (1)$$

Co: fully charged capacity of secondary battery, Cr: residual capacity of secondary battery $$SOC = SOCo + 100 \times \int I dt / Co \quad (2)$$

SOCo: initial value of SOC, I: electric current

A management device 40 which controls the battery 20 is formed of the printed circuit board 90, the BM 51, the memory 53, the voltage detection part 55, a connector 100, and the resistor 80.

2. Connection Structure of Resistor 80

Figure 5:
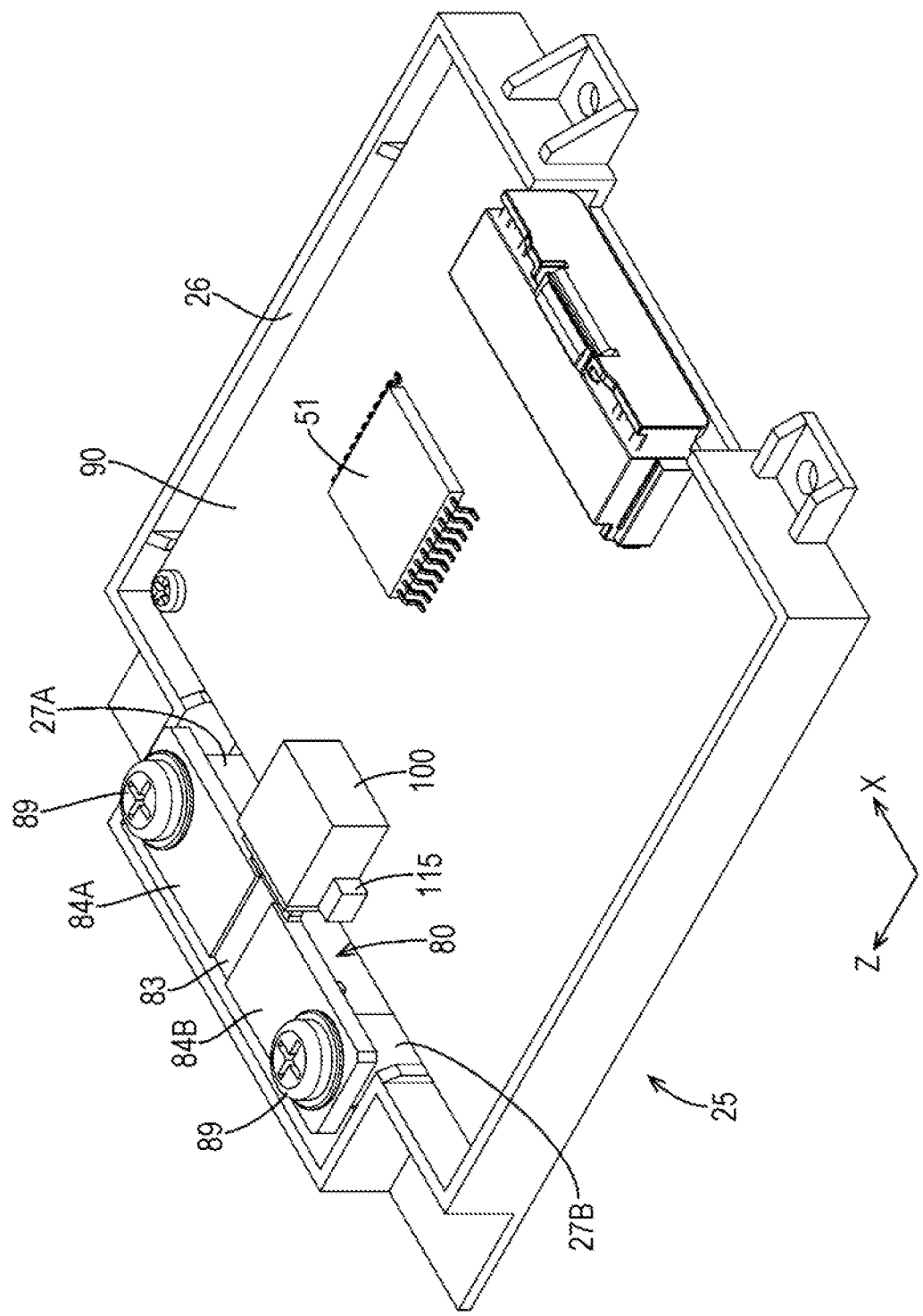
FIG. 5 is a perspective view of a middle lid.

As shown in FIG. 3, a first accommodating portion 25A and a second accommodating portion 25B are formed on an upper surface of the middle lid 25. These two accommodating portions 25A, 25B are surrounded by an outer wall 26. As shown in FIG. 5, the printed circuit board 90 is accommodated in the first accommodating portion 25A in a state where the printed circuit board 90 is fixed to the first accommodating portion 25A by screws. Bosses 27A, 27B having a circular cylindrical shape are disposed on both sides of the second accommodating portion 25B in the X direction, and the resistor 80 is accommodated in the second accommodating portion 25B in a state where plate portions 84A, 84B positioned on both sides of the resistor 80 in the X direction are fixed to the respective bosses 27A, 27B by screws. The bosses 27A, 27B are provided for aligning a height of a first terminal 130 of the connector 100 on a printed circuit board 90 and a height of a second terminal 87 on a resistor 80 with each other.

The printed circuit board 90 has substantially a rectangular shape, and the connector 100 is disposed on an upper surface of the printed circuit board 90. The connector 100 is disposed on a portion of the printed circuit board 90 which opposedly faces the resistor 80. The printed circuit board 90, the connector 100, and the resistor 80 correspond to "current detector" of the present invention.

Figure 6:
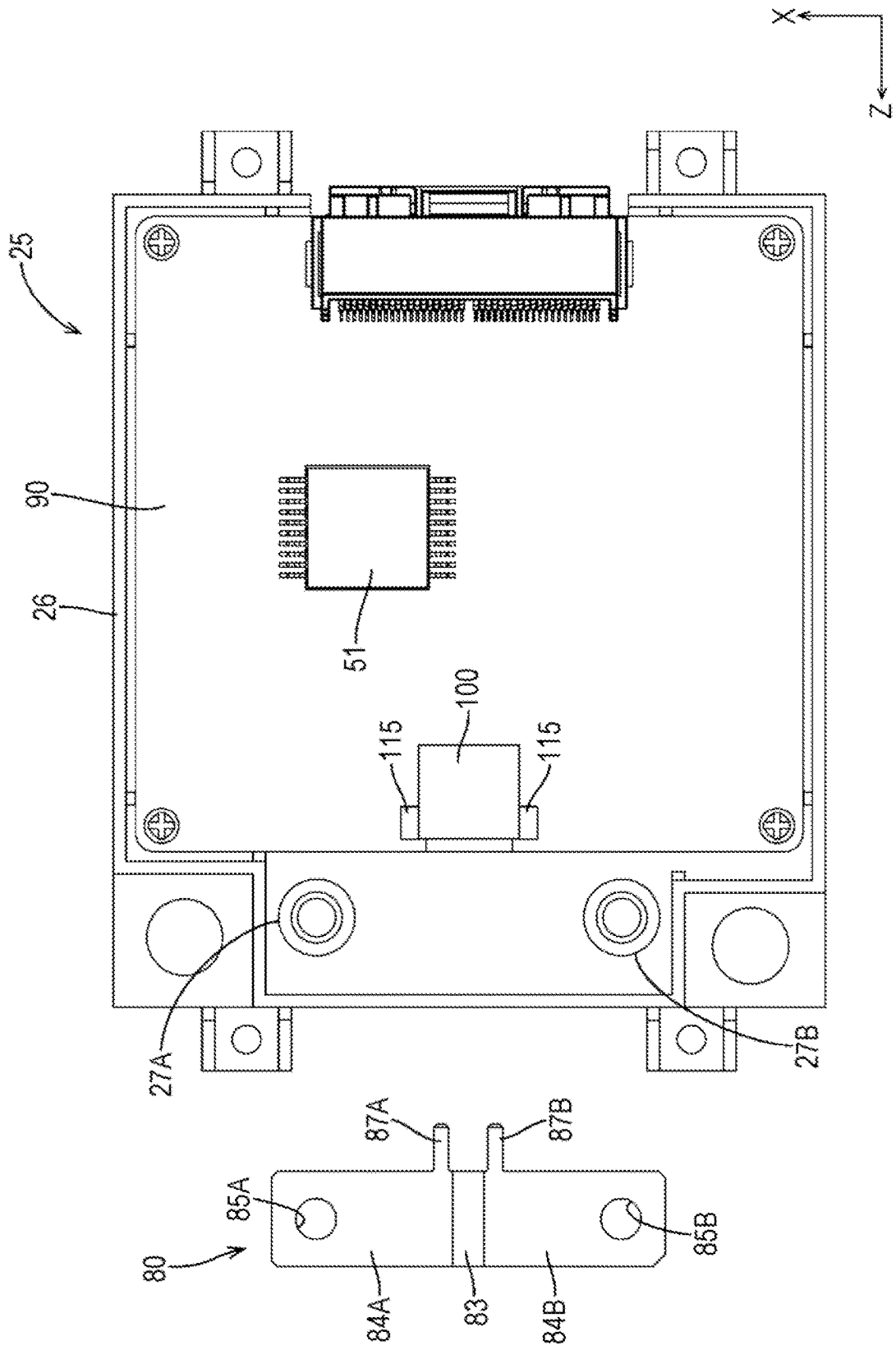
FIG. 6 is a plan view of the middle lid.
Figure 7:
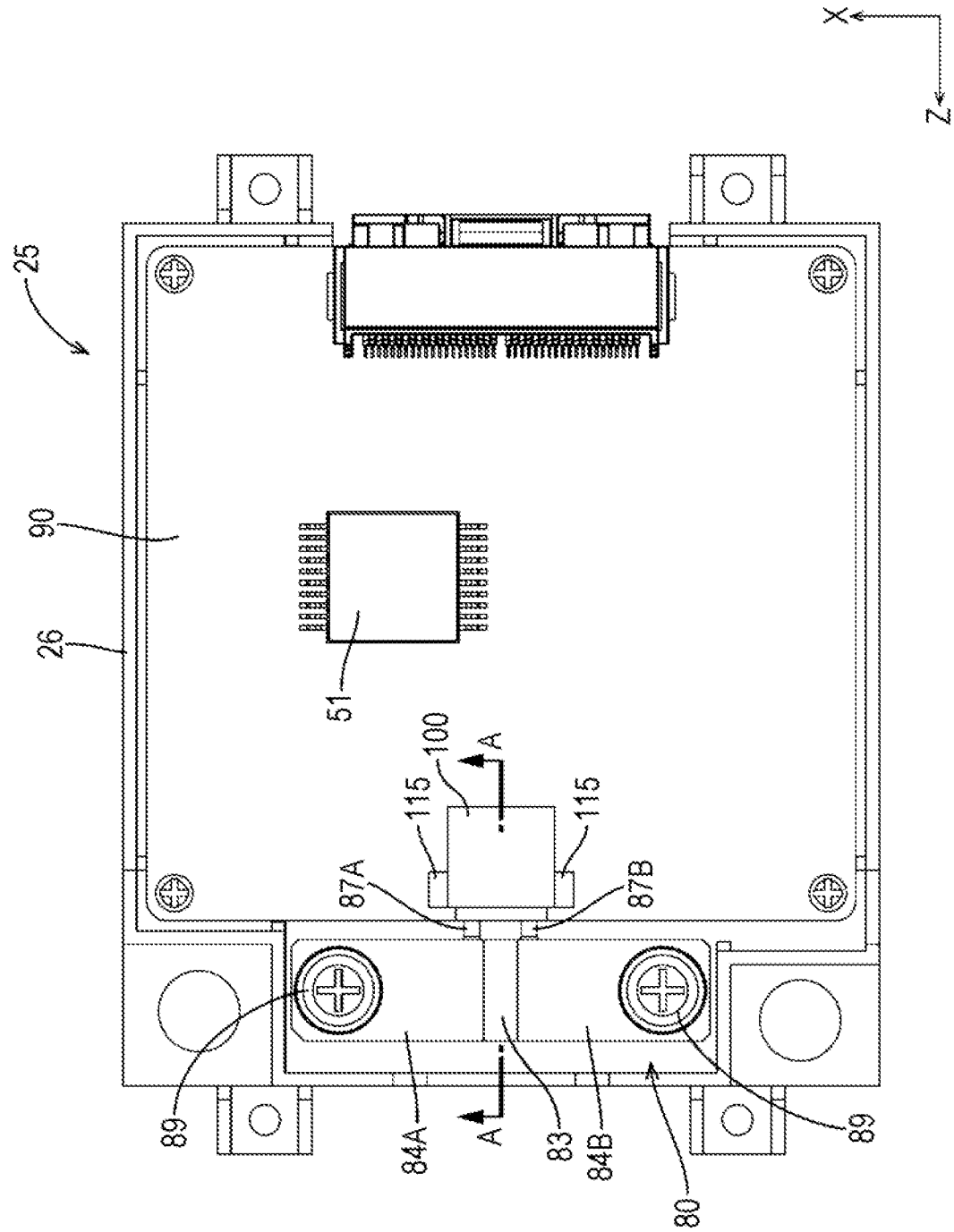
FIG. 7 is a plan view of the middle lid.

In FIG. 5 to FIG. 7, the illustration of the current shut off device 45, the memory 53, and the voltage detection part 55 is omitted.

Figure 9:
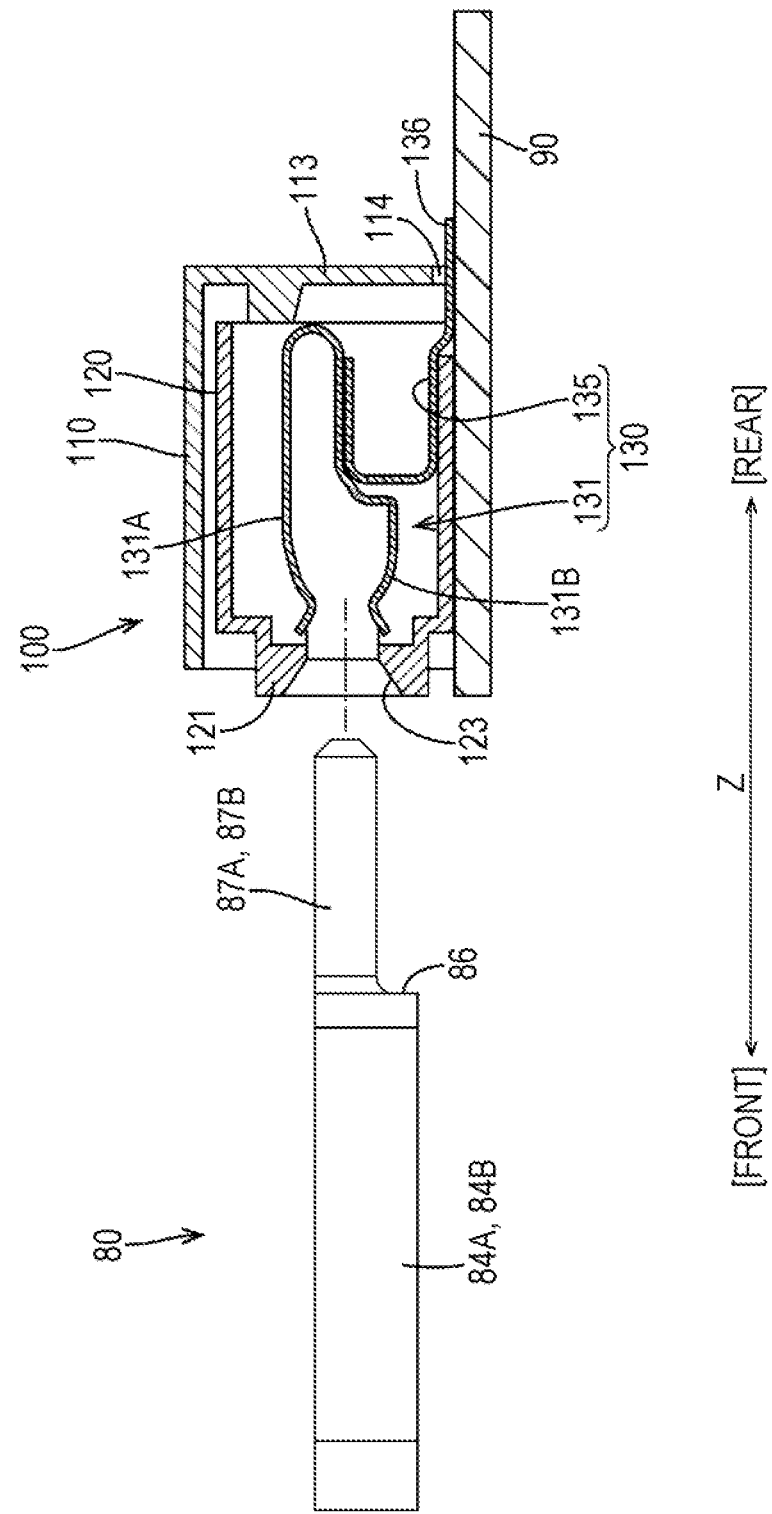
FIG. 9 is a cross-sectional view taken along line A-A in FIG. 7.
Figure 10:
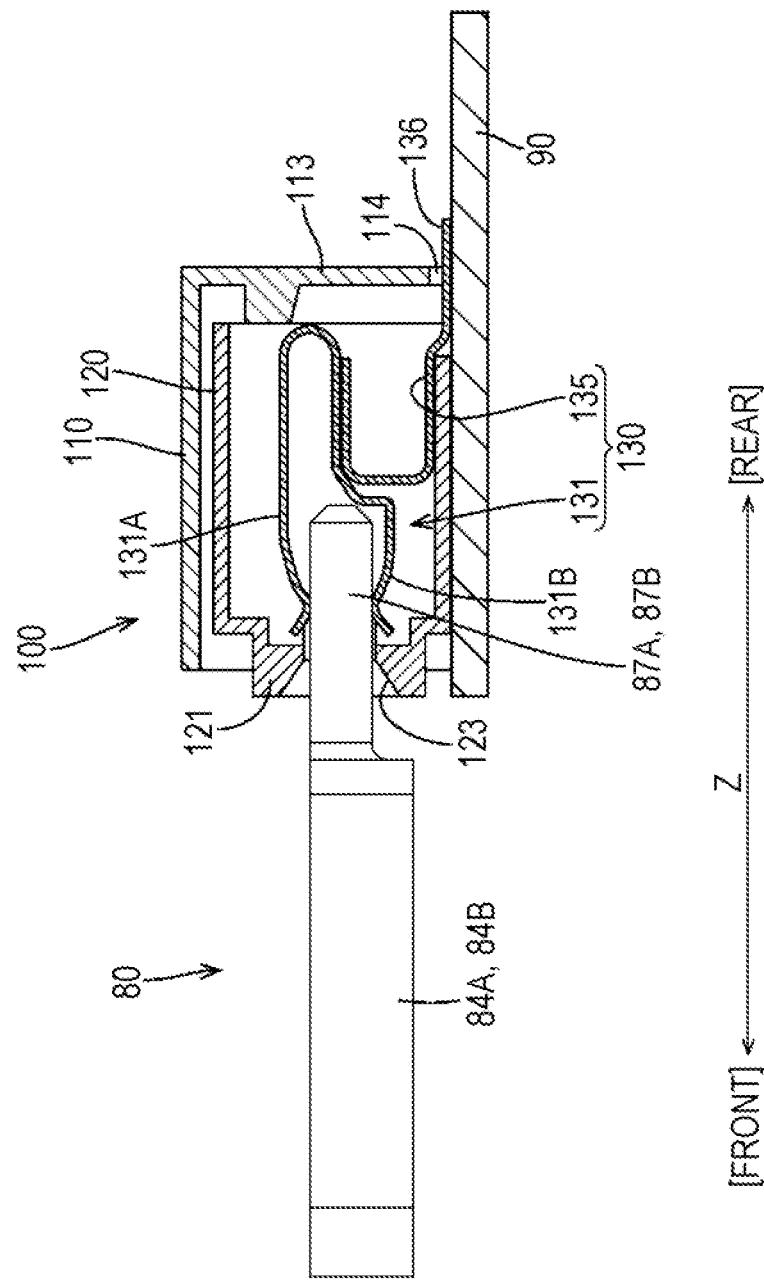
FIG. 10 is a cross-sectional view taken along line A-A in FIG. 7.

As shown in FIG. 9 and FIG. 10, the connector 100 includes an outer housing 110, an inner housing 120, and the first terminal 130.

The outer housing 110 is made of a synthetic resin, and is a fixed housing fixed to an upper surface of the printed circuit board 90 by a fixing portion 115 such as a pawl. The outer housing 110 opens on a front surface side which opposedly faces the resistor 80, and the inner housing 120 is accommodated in the inside of the outer housing 110.

The inner housing 120 is made of a synthetic resin, and is accommodated in the inside of the outer housing 110. The inner housing 120 is supported in the inside of the outer housing 110 by a support portion (not shown in the drawing) formed on the outer housing 110 such that the movement of the inner housing 120 in the Z direction (an insertion direction of the second terminal into the first terminal) is restricted, and the movement of the inner housing 120 in the X direction is allowed. The inner housing 120 is a movable housing which moves in the X direction with respect to the outer housing 110.

The first terminal 130 is disposed in the inside of the inner housing 120. The first terminal 130 is formed of a spring member made of metal, for example, and includes a front side terminal portion 131 and a rear side terminal portion 135. The front side terminal portion 131 includes a pair of upper and lower contact lugs 131A, 131B.

The upper and lower contact lugs 131A, 131B are disposed corresponding to an insertion hole 123 formed in a front surface wall 121 of the inner housing 120 in the inside of the inner housing 120. The upper and lower contact lugs 131A, 131B are elastically brought into contact with the second terminals 87A, 87B inserted through the insertion hole 123.

The rear side terminal portion 135 has a connecting portion 136 connected to the printed circuit board 90. The connecting portion 136 projects to the outside through a through hole 114 formed in a deep side wall 113 of the outer housing 110, and is bonded to a conductive pattern (not shown in the drawing) formed on an upper surface of the printed circuit board 90 by soldering, for example. In FIG. 9 and FIG. 10, only one first terminal 130 is shown. However, in an actual structure, two first terminals 130 are arranged in an X direction.

Figure 8:
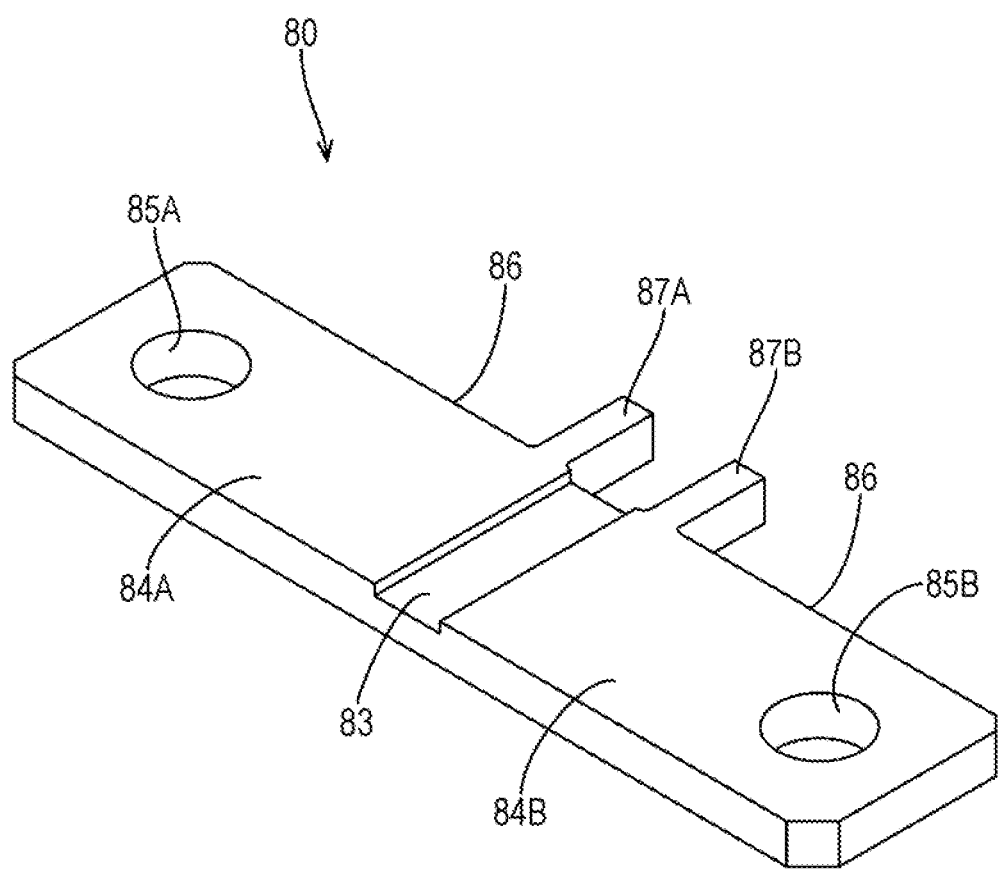
FIG. 8 is a perspective view of a resistor.

As shown in FIG. 8, the resistor 80 is formed into a rectangular shape elongated in the X direction as a whole. The resistor 80 has plate surfaces extending in X-Z directions, and is disposed substantially parallel to the printed circuit board 90. The resistor 80 includes a resistance body 83, a pair of plate portions 84A, 84B, and a pair of second terminals 87A, 87B. The resistance body 83 is made of Manganin (registered trademark). The resistance body 83 generates a voltage drop (voltage difference) proportional to an electric current.

The pair of plate portions 84A, 84B is made of copper. The pair of plate portions 84A, 84B is arranged on both sides of the resistance body 83 in the X direction. The pair of plate portions 84A, 84B has threaded holes 85A, 85B.

The resistor 80 is mounted on the second accommodating portion 25B of the middle lid 25 by fixing the pair of plate portions 84A, 84B to the bosses 27A, 27B together with a metal plate not shown in the drawing which form the electricity supply path 35 (see FIG. 4) by screws 89.

The pair of second terminals 87A, 87B is disposed on both sides of the resistance body 83. To be more specific, the pair of second terminals 87A, 87B is disposed substantially parallel to the plate portions 84A, 84B and in a projecting manner in the Z direction from an end surfaces 86 of the pair of plate portions 84A, 84B. The second terminals 87A, 87B are made of copper and are integrally formed with the pair of plate portions 84A, 84B.

As shown in FIG. 9 and FIG. 10, the second terminals 87A, 87B pass through the insertion holes 123 formed in the front surface wall 121 of the inner housing 120 in the Z direction, and are fitted in the inside of the front side terminal portion 131 disposed in the inside of the inner housing 120.

That is, the second terminals 87A, 87B are positioned between upper and lower contact lugs 131A, 131B, and in a fitting state, distal end portions of the upper and lower contact lugs 131A, 131B are elastically brought into contact with outer peripheral surfaces of the second terminals 87A, 87B.

In this manner, the upper and lower contact lugs 131A, 131B are elastically brought into contact with the second terminals 87A, 87B and hence, the resistor 80 is electrically connected to the conductive pattern (not shown in the drawing) of the printed circuit board 90 via the second terminal 87 and the first terminal 130. The BM 51 disposed on the printed circuit board is electrically connected to the resistor 80 and hence, a both end voltage Vr of the resistor 80 can be detected. Then, an electric current I of the secondary battery 31 can be detected based on the detected both end voltage Vr.

3. Description of Advantageous Effects

Figure 11:
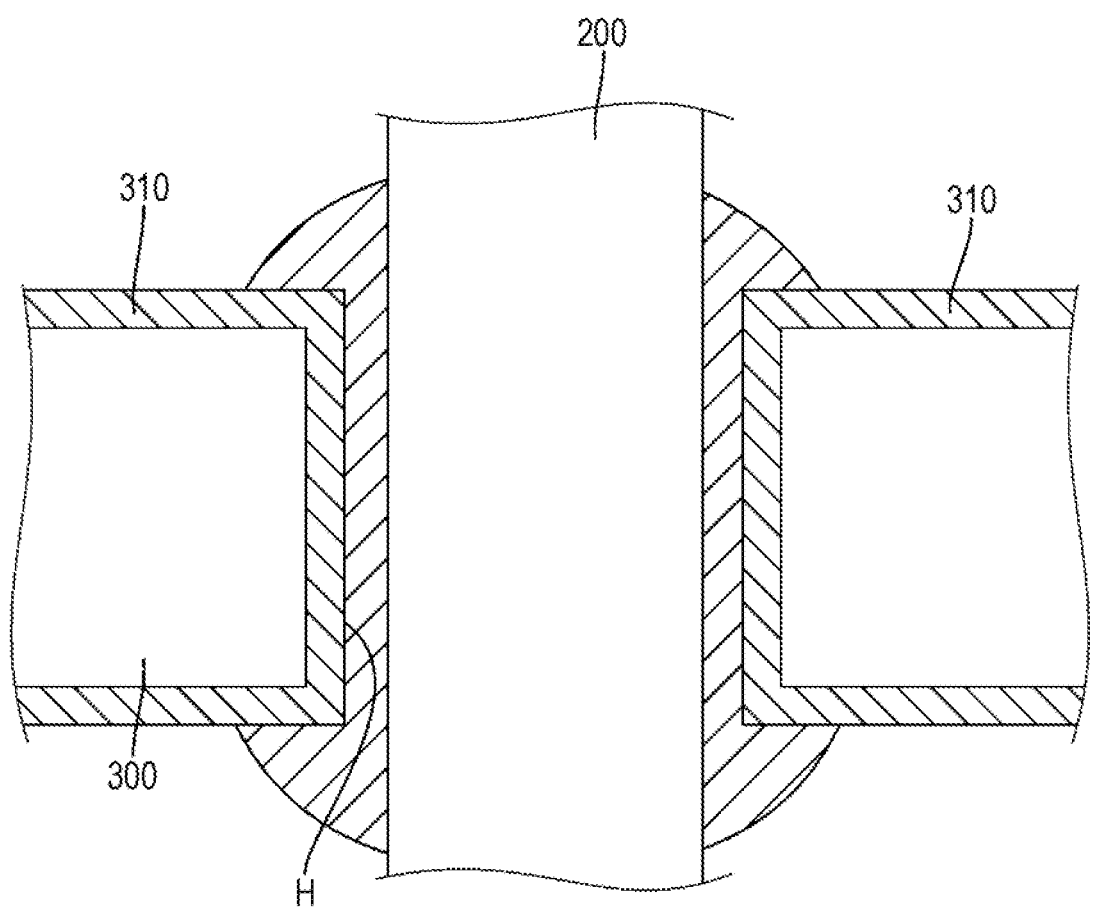
FIG. 11 is a cross-sectional view showing a bonding structure of a terminal using a through hole.

FIG. 11 is a cross-sectional view when a terminal 200 of a resistor is made to pass through a through hole H and is bonded to a conductive pattern 310 of a printed circuit board 300 by soldering. FIG. 12 is a graph showing a change in a resistance value caused by a temperature cycle with respect to the case where the terminal 200 of the resistor is made to pass through the through hole H and is bonded to the conductive pattern 310 of the printed circuit board 300 by soldering. In bonding the terminal 200 of the resistor using solder bonding, when the cycle number of a temperature cycle exceeds a predetermined number, a resistance value of the resistor is sharply increased. This is because that a solder crack occurs in a bonding portion due to the difference in a thermal expansion coefficient between the printed circuit board (resin) and the terminal (metal).

In the configuration of this embodiment, the resistor 80 which is a heat generating body is electrically connected to the printed circuit board 90 by bringing the second terminals 87A, 87B of the resistor 80 into contact with the first terminal 131 of the connector 100. Since solder bonding using a through hole is not used in electrically connecting the resistor 80 which is a heat generating body and the printed circuit board 90, a solder crack does not occur so that the increase of a resistance value due to a temperature cycle can be suppressed.

The battery 20 is provided for starting an engine, and a large electric current flows within a short time at the time of cranking. Accordingly, a thermal shock is large so that a temperature of the resistor 80 is particularly easily increased. When solder bonding using a through hole is adopted, provability of the occurrence of a solder crack is high and hence, there is a particularly high possibility that a resistance value is increased. With the configuration of this embodiment, the increase of a resistance value can be effectively suppressed. Accordingly, even when a temperature cycle is repeated, current measurement accuracy of the secondary battery 31 becomes high.

A current integration method cumulates current measurement errors and hence, when the measurement is performed for a long period, there arises a drawback that estimation accuracy of an SOC is lowered. According to the configuration of this embodiment, an electric current can be measured with high accuracy and hence, accumulation of errors can be decreased whereby estimation accuracy of the SOC can be enhanced.

Further, the connector 100 is mounted on the printed circuit board 90 and hence, a signal line for connecting the connector 100 and the printed circuit board 90 to each other becomes unnecessary whereby the number of parts can be decreased.

With the configuration of this embodiment, the second terminals 87A, 87B are disposed substantially parallel to the plate portions 84A, 84B and in a projecting manner from the plate portions 84A, 84B and hence, the second terminals 87A, 87B can be easily fitted into the first terminal 130 of the connector 100. Accordingly, assembling property of the resistor 80 can be enhanced.

With the configuration of this embodiment, the second terminals 87A, 87B form parts of the same member as the plate portions 84A, 84B. By forming the second terminals 87A, 87B as the portions of the same member as the plate portions 84A, 84B, compared to the case where the second terminals 87A, 87B and the plate portions 84A, 84B are formed of different members (different kinds of metals), a connection resistance between the second terminals 87A, 87B and the plate portions 84A, 84B is small and hence, measurement accuracy of an electric current by the resistor 80 can be enhanced.

Figure 13A:
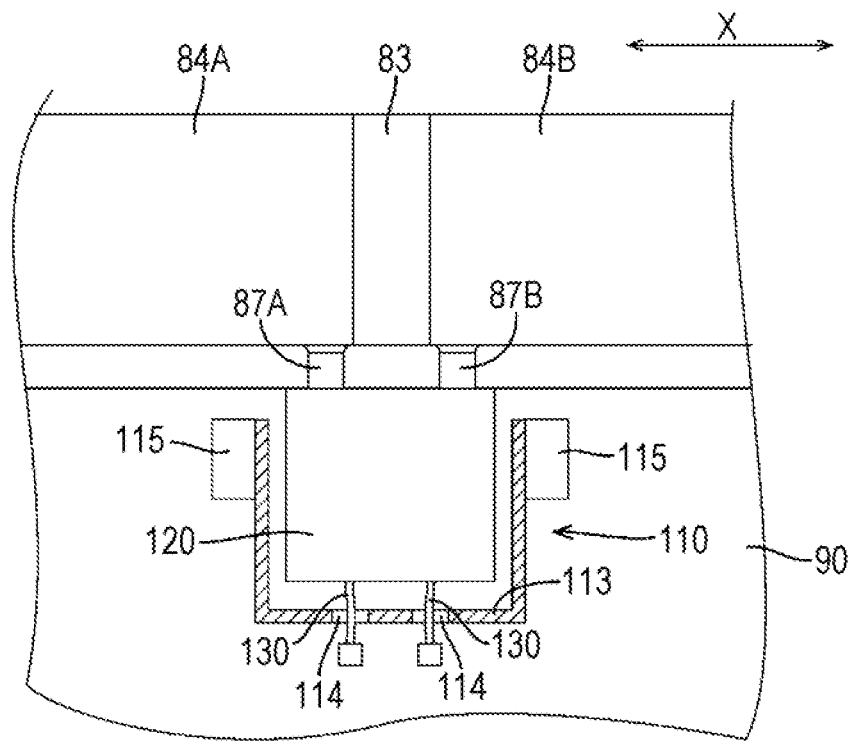
FIG. 13 is a cross-sectional view of a connector showing a positional relationship between an outer housing and an inner housing.
Figure 13B:
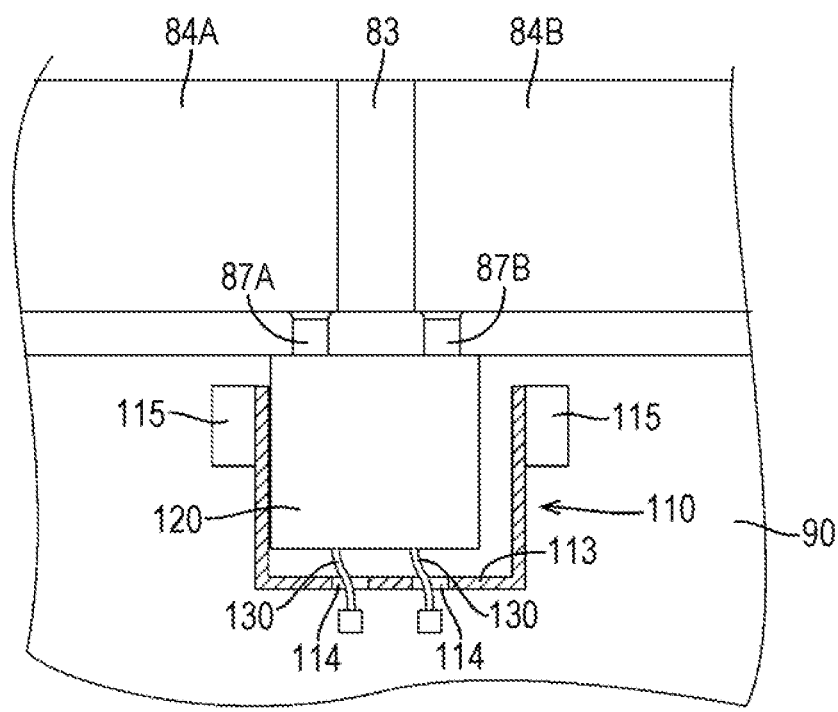

With the configuration of this embodiment, when the resistor 80 is positionally displaced with respect to the printed circuit board 90 in the X direction at the time of assembling the current detector, as shown in FIG. 13, the inner housing 120 moves in the inside of the outer housing 110 in the X direction and hence, the positional displacement of the resistor 80 can be absorbed. Accordingly, a contact state between the first terminal 130 of the connector 100 and the second terminal 87 of the resistor 80 can be maintained and hence, the increase of a resistance value can be suppressed. Further, it is possible to provide the current detector having the configuration which strongly resists against vibration after being assembled.

(A) of FIG. 13 shows a positional relationship between the outer housing 110 and the inner housing 120 when there is no positional displacement between the outer housing 110 and the inner housing 120, and (B) of FIG. 13 shows a positional relationship between the outer housing 110 and the inner housing 120 when the positional displacement occurs between the outer housing 110 and the inner housing 120.

It is sufficient that the second terminals 87A, 87B of the resistor 80 have a length (approximately several centimeters) which enables fitting of the second terminals 87A, 87B in the connector 100 and hence, a total length of the second terminals 87A, 87B is short compared to the connection structure which uses a signal line. Accordingly, the second terminals 87A, 87B exhibit high resistance against an electromagnetic noise (hardly forming antennas which receive noise) and hence, the second terminals 87A, 87B exhibit high current measurement accuracy.

The connecting portion 136 (see FIG. 10) of the rear side terminal portion 135 of the connector 100 is bonded to the conductive pattern of the printed circuit board 90 by soldering. However, the rear side terminal portion 135 generates small heat compared to the resistor 80 and hence, there is low possibility that a solder crack occurs at a bonding portion with the conductive pattern.

Other Embodiments

The present invention is not limited to the embodiment described with reference to the above-mentioned description and drawings. For example, the following embodiments also fall within a technical scope of the present invention.

(1) In the embodiment 1, the secondary battery 31 is exemplified as one example of the electrochemical device. However, the electrochemical device may be an energy storage device such as a secondary battery or an electric double layered capacitor, or a primary battery which performs only discharging. The vehicle is not limited to the automobile 1, and may be a motorcycle. The application of the battery 20 is not limited to a vehicle, and the battery 20 may be used in other applications such as an uninterruptable power supply (UPS) or an energy storage part of a solar power system.

(2) In the embodiment 1, the connector 100 adopts the double housing structure formed of the outer housing 110 and the inner housing 120, and the inner housing 120 is made movable. The connector 100 is not limited to the double housing structure, and may be configured such that the inner housing 120 is fixed to the printed circuit board 90 by eliminating the outer housing 110. Further, the embodiment 1 adopts the configuration where the inner housing 120 is movable in the X direction with respect to the outer housing 110. However, the inner housing 120 may be movable in the Y direction or in two directions consisting of the X direction and the Y direction.

(3) In the embodiment 1, the management device 40 is formed of the printed circuit board 90, the BM 51, the memory 53, the voltage detection part 55, the connector 100, and the resistor 80. It is sufficient that the management device 40 include at least the printed circuit board 90, the BM 51, the connector 100, and the resistor 80, and other parts are auxiliary parts. It is sufficient that the BM 51 which forms the data processing part have at least a function of monitoring an electric current I based on a both end voltage Vr of the resistor 80, and whether or not the BM 51 performs SOC estimation is arbitrary. It is sufficient that the printed circuit board 90 have at least the connector 100 which becomes a connection counterpart for the resistor 80. Whether or not other parts such as the BM 51 are mounted on the printed circuit board 90 is arbitrary. For example, the configuration may be adopted where other parts such as the BM 51 are mounted on another printed circuit board electrically connected to the printed circuit board 90. Further, the BM 51 mounted on another printed circuit board may be provided outside the battery 20. That is, it is sufficient that the battery 20 include at least the secondary battery 31, the resistor 80, the printed circuit board 90, and the connector 100.

DESCRIPTION OF REFERENCE SIGNS 20 battery
31 secondary battery
40 management device
51 BM (corresponding to a "data processing part" of the present invention)
80 resistor
83 resistance body
84A, 84B plate portion
87A, 87B second terminal
90 circuit board
100 connector
110 outer housing
120 inner housing
130 first terminal

What is claimed is:

1. A current detector of an electrochemical device, comprising:
    a printed circuit board; and
    a resistor for detecting an electric current of the electrochemical device,
    wherein:
        a connector having a first terminal is mounted on the printed circuit board,
        the resistor has a second terminal which is brought into contact with the first terminal,
        the resistor includes a resistance body and plate portions positioned on both sides of the resistance body, and
        the second terminal is integrally formed with one of the plate portions.

2. The current detector according to claim 1, wherein:
    the plate portions are disposed substantially parallel to the printed circuit board,
    the second terminal is disposed substantially parallel to the plate portion and in a projecting manner from the plate portion, and
    the second terminal is fitted in the inside of the first terminal of the connector.

3. The current detector according to claim 1, wherein:
    the connector includes: an outer housing fixed to the printed circuit board; and
    an inner housing disposed movable in the inside of the outer housing, and the first terminal is held in the inner housing.

4. A management device of an energy storage device, comprising:
    the current detector according to claim 1; and
    a data processing part mounted on the printed circuit board,
    wherein the data processing part is configured to estimate a charge state of the energy storage device based on an electric current detected by the resistor.

5. A battery for starting an engine mounted on a vehicle, the battery comprising:
    an energy storage device; and
    the current detector according to claim 1.

6. A battery for starting an engine mounted on a vehicle, the battery comprising:
    an energy storage device; and
    the management device according to claim 4.

7. A current detector of an electrochemical device, comprising:
- a printed circuit board; and
- a resistor for detecting an electric current of the electrochemical device, wherein:
- a connector having a first terminal is mounted on the printed circuit board,
- the resistor has a second terminal which is brought into contact with the first terminal;
- the connector includes: an outer housing fixed to the printed circuit board; and
- an inner housing disposed movable in the inside of the outer housing, and the first terminal is held in the inner housing.

8. The current detector according to claim 7, wherein:
- the resistor includes: a resistance body; and plate portions positioned on both sides of the resistance body and disposed substantially parallel to the printed circuit board,
- the second terminal is disposed substantially parallel to the plate portion and in a projecting manner from the plate portion, and
- the second terminal is fitted in the inside of the first terminal of the connector.

9. The current detector according to claim 7, wherein the second terminal forms a part of the same member as the plate portion.

* * * * *